United States Patent
Haraguchi et al.

(10) Patent No.: US 6,704,229 B2
(45) Date of Patent: Mar. 9, 2004

(54) SEMICONDUCTOR TEST CIRCUIT FOR TESTING A SEMICONDUCTOR MEMORY DEVICE HAVING A WRITE MASK FUNCTION

(75) Inventors: Masaru Haraguchi, Hyogo (JP); Tetsushi Tanizaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/122,365

(22) Filed: Apr. 16, 2002

(65) Prior Publication Data

US 2003/0043663 A1 Mar. 6, 2003

(30) Foreign Application Priority Data

Aug. 28, 2001 (JP) ......................................... 2001-258120

(51) Int. Cl.$^7$ .................................................. G11C 7/00
(52) U.S. Cl. .................................. 365/201; 365/189.01
(58) Field of Search .......................... 365/201, 189.01, 365/189.05, 189.07, 195

(56) References Cited

U.S. PATENT DOCUMENTS

| 5,568,434 A | 10/1996 | Jeon ............................ 365/201 |
| 6,252,804 B1 * | 6/2001 | Tomita ................... 365/189.05 |
| 2003/0043664 A1 * | 3/2003 | Haraguchi et al. ........... 365/201 |

FOREIGN PATENT DOCUMENTS

JP  8-54446  2/1996

* cited by examiner

*Primary Examiner*—Anh Phung
(74) *Attorney, Agent, or Firm*—McDermott, Will & Emery

(57) ABSTRACT

In a test circuit for testing an eDRAM provided with a write mask function, eight internal expected values are generated based on a prescribed read data signal among read data signals of one unit of write mask (i.e., eight). Determination is performed as to whether the eight read data signals and the eight internal expected values respectively match or not, and when they match, the eight memory cells are determined to be normal. Thus, a multi-bit test can be performed even when a test pattern is written using a write mask function.

10 Claims, 15 Drawing Sheets

FIG.8
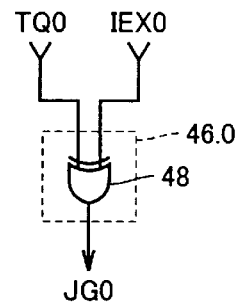
FIG.9
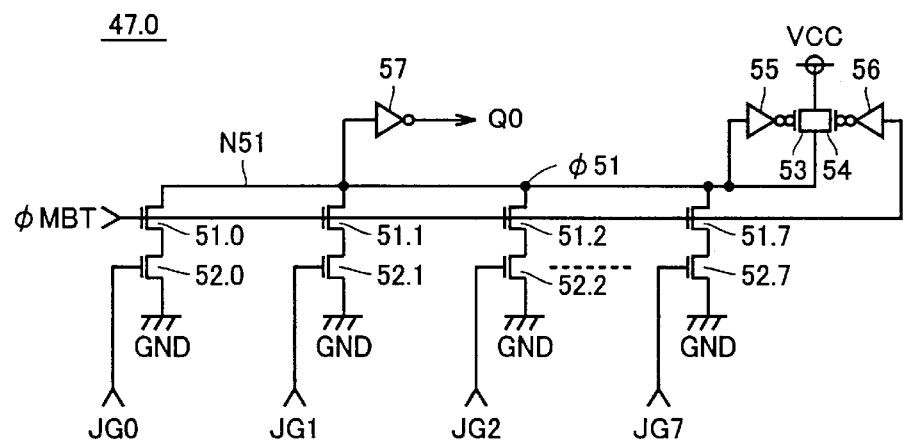
FIG.10A
| φ40.0 | φ40.1 | ----- | φ40.6 | φ40.7 |
|---|---|---|---|---|
| H | L | ----- | H | L |
FIG.10B
|  | DM0 | EDI | TD0 | TD1 | ----- | TD6 | TD7 |
|---|---|---|---|---|---|---|---|
| (1) | L | H | L | H | ----- | L | H |
| (2) | H | H | L | H | ----- | L | H |
| (3) | L | L | H | L | ----- | H | L |
| (4) | H | L | H | L | ----- | H | L |

WHEN MEMORY CELLS MC0-7 ARE ALL NORMAL
FIG.11A WRITE
| EDI | φ40.0 | φ40.7 | TD0 | TD7 |
|---|---|---|---|---|
| L | L | H | L | H |
| L | H | L | H | L |
| H | L | H | H | L |
| H | H | L | L | H |
FIG.11C READ
| TQ0 | TQ7 | φ43.0 | IEX0 | IEX7 |
|---|---|---|---|---|
| H | L | H | H | L |
| L | H | H | L | H |
| L | H | L | L | H |
| H | L | L | H | L |
JG0=JG7=Q0=L
S0=H ↑
 S0=L →
FIG.11B READ
| TQ0 | TQ7 | EEX | IEX0 | IEX7 |
|---|---|---|---|---|
| L | H | L | L | H |
| H | L | L | H | L |
| H | L | H | H | L |
| L | H | H | L | H |
JG0=JG7=Q0=L

WHEN MEMORY CELL MC0 IS DEFECTIVE AND MEMORY CELLS MC1-7 ARE NORMAL

FIG.12A WRITE

| EDI | φ40.0 | φ40.7 | TD0 | TD7 |
|---|---|---|---|---|
| L | L | H | L | H |
| L | H | L | H | L |
| H | L | H | H | L |
| H | H | L | L | H |

S0=L →

FIG.12B READ

| TQ0 | TQ7 | EEX | IEX0 | IEX7 |
|---|---|---|---|---|
| H | H | L | L | H |
| L | L | L | H | L |
| L | L | H | H | L |
| H | H | H | L | H |

JG0=H,JG7=L,Q0=H

S0=H ↑

FIG.12C READ

| TQ0 | TQ7 | φ43.0 | IEX0 | IEX7 |
|---|---|---|---|---|
| L | L | L | L | H |
| H | H | L | H | L |
| H | H | H | H | L |
| L | L | H | L | H |

JG0=L,JG7=H,Q0=H

WHEN MEMORY CELL MC0 IS NORMAL AND MEMORY CELLS MC1-7 ARE DEFECTIVE
FIG.13C READ
| TQ0 | TQ7 | φ43.0 | IEX0 | IEX7 |
|---|---|---|---|---|
| H | H | H | H | L |
| L | L | H | L | H |
| L | L | L | L | H |
| H | H | L | H | L |
JG0=L,JG7=H,Q0=H
S0=H
FIG.13A WRITE
| EDI | φ40.0 | φ40.7 | TD0 | TD7 |
|---|---|---|---|---|
| L | L | H | L | H |
| L | H | L | H | L |
| H | L | H | H | L |
| H | H | L | L | H |
S0=L
FIG.13B READ
| TQ0 | TQ7 | EEX | IEX0 | IEX7 |
|---|---|---|---|---|
| L | L | L | L | H |
| H | H | L | H | L |
| H | H | H | H | L |
| L | L | H | L | H |
JG0=L,JG7=H,Q0=H

WHEN MEMORY CELLS MC0-7 ARE ALL DEFECTIVE

FIG.14A WRITE

| EDI | φ40.0 | φ40.7 | TD0 | TD7 |
|-----|-------|-------|-----|-----|
| L | L | H | L | H |
| L | H | L | H | L |
| H | L | H | H | L |
| H | H | L | L | H |

↓ S0=L

FIG.14B READ

| TQ0 | TQ7 | EEX | IEX0 | IEX7 |
|-----|-----|-----|------|------|
| H | L | L | L | H |
| L | H | L | H | L |
| L | H | H | H | L |
| H | L | H | L | H |

JG0=JG7=Q0=H

↑ S0=H

FIG.14C READ

| TQ0 | TQ7 | φ43.0 | IEX0 | IEX7 |
|-----|-----|-------|------|------|
| L | H | L | L | H |
| H | L | L | H | L |
| H | L | H | H | L |
| L | H | H | L | H |

JG0=JG7=Q0=L

SEMICONDUCTOR TEST CIRCUIT FOR TESTING A SEMICONDUCTOR MEMORY DEVICE HAVING A WRITE MASK FUNCTION

BACKGROUND OF THE INVENTION

1. Field of the Invention

The present invention relates to a semiconductor test circuit, and more specifically, to a semiconductor test circuit for testing a semiconductor memory device having a write mask function.

2. Description of the Background Art

Conventionally, a system LSI having a logic circuit and an eDRAM (embedded DRAM) merged is being developed. Between the logic circuit and the eDRAM, simultaneous inputting and outputting of several hundred (for instance, 256) data signals is made possible in order to achieve improved data transfer rate. In addition, one write mask signal is provided for every prescribed number (for instance, eight) of data signals, and it becomes possible to inhibit the rewriting of data signals of the corresponding prescribed number of memory cells by controlling the write mask signal. Moreover, in the system LSI, a test circuit is provided for testing with few test pins whether each memory cell within the eDRAM is normal or defective.

FIGS. 17A and 17B are circuit block diagrams representing the main portion of the test circuit in such a system LSI. For simplicity of the drawings and description, only the portion related to 16 data signals TDQ0 to TDQ15 will be described.

In FIGS. 17A and 17B, the test circuit includes data scramble registers 80.0 to 80.15 and EX-OR gates 81.0 to 81.15. An external write data signal EDI is input to one input node of each of EX-OR gates 81.0 to 81.15. Output signals $\phi 80.0$ to $\phi 80.15$ from registers 80.0 to 80.15 are respectively input to the other input nodes of EX-OR gates 81.0 to 81.15. Signals $\phi 80.0$ to $\phi 80.15$ are set, for instance, alternately to the logic high or "H" level and the logic low or "L" level in advance. Output signals from EX-OR gates 81.0 to 81.15 become internal write data signals TD0 to TD15, respectively.

When external write data signal EDI is set to the "H" level, data signals TD0 to TD15 alternately attain the "L" level and the "H" level according to output signals $\phi 80.0$ to $\phi 80.15$ from data scramble registers 80.0 to 80.15. When data signal EDI is set to "L" level, data signals TD0 to TD15 alternately attain the "H" level and the "L" level according to output signals $\phi 80.0$ to $\phi 80.15$ from data scramble registers 80.0 to 80.15. Data signals TD0 to TD15 are respectively written into 16 memory cells MC0 to MC15 designated by an address signal. It is, however, made possible to inhibit writing of data signals TD0 to TD7 and/or TD8 to TD15 by two write mask signals.

In addition, the test circuit further includes EX-OR gate circuits 82.0 to 82.15, determination circuits 83.0 to 83.15, and a determination result compressing circuit 84. An external expected value EEX is input to one input node of each of EX-OR gates 82.0 to 82.15. Output signals $\phi 80.0$ to $\phi 80.15$ from registers 80.0 to 80.15 are respectively input to the other input nodes of EX-OR gates 82.0 to 82.15. EX-OR gates 82.0 to 82.15 respectively output internal expected values IEX0 to IEX15. External expected value EEX is input in synchronization with read data signals TQ0 to TQ15, and its logic level is set to be the same as the logic level of external write data signal EDI upon writing of write data signals TD0 to TD15 corresponding to read data signals TQ0 to TQ15. Thus, internal expected values IEX0 to IEX15 respectively become the same as internal write data signals TD0 to TD15.

Determination circuits 83.0 to 83.15 respectively receive internal expected values IEX0 to IEX15 and read data signals TQ0 to TQ15. Determination circuit 83.0 determines whether the logic level of read data signal TQ0 matches the logic level of internal expected value IEX0, and causes a signal JG0 to attain the "L" level that indicates that a corresponding memory cell MC0 is normal when the logic levels match, and causes signal JG0 to attain the "H" level that indicates that the corresponding memory cell MC0 is defective when the logic levels do not match. Other determination circuits 83.1 to 83.15 are the same as determination circuit 83.0.

Determination result compressing circuit 84 receives output signals JG0 to JG15 from determination circuits 83.0 to 83.15, and causes a signal Q0 to attain the "L" level when signals JG0 to JG15 are all at the "L" level, and causes signal Q0 to attain the "H" level when at least one of signals JG0 to JG15 is at the "H" level. Thus, the detection of the logic level of signal Q0 allows the detection of whether 16 memory cells MC0 to MC15 are normal or not.

In the case, however, where write mask control is performed with respect to data signals TD0 to TD7, for instance, during a write operation, the data signals of memory cells MC0 to MC7 corresponding to data signals TD0 to TD7 will not be rewritten so that, even if the logic level of external write data signal EDI during the write operation is made to be the same as the logic level of the expected value EEX during the read operation, internal expected values IEX0 to IEX7 and write data signals TD0 to TD7 would not necessarily match. Therefore, conventionally, a test that accompanies the write mask control during the write operation did not allow the use of a time reducing technique such as the above-described multi-bit test and thus involved the problem of a longer test time.

SUMMARY OF THE INVENTION

Thus, the principle object of the present invention is to provide a semiconductor test circuit capable of performing a multi-bit test even when a test pattern is written using a write mask function.

A semiconductor test circuit according to the present invention is a circuit for testing a semiconductor memory device having a function simultaneously to perform writing/reading of data signals of a plurality of memory cells designated by an address signal and having a write mask function to inhibit rewriting of the data signals of the plurality of memory cells. The semiconductor test circuit is provided with a write data generating circuit for generating a plurality of internal write data signals to be written into the plurality of memory cells of one unit of write mask according to an external write data signal, an internal expected value generating circuit for generating a plurality of internal expected value signals based on a read data signal from a predetermined memory cell among the plurality of memory cells, and a determination circuit for determining whether the logic levels of a plurality of read data signals from the plurality of memory cells and the logic levels of the plurality of internal expected value signals generated in the internal expected value generating circuit respectively match or not, and outputting a signal of a first level when the logic levels match in all respective pairs, and outputting a signal of a second level when the logic levels do not match at least in one pair. Thus, the plurality of internal expected values are generated based on a read data signal from a predetermined memory cell among the plurality of memory cells, and match/mismatch of the read data signals and the internal expected values is determined per unit of write mask so that the multi-bit test can be performed even when the test pattern is written using the write mask function.

Preferably, the write data generating circuit includes a plurality of registers each of which holds and outputs a data signal supplied in advance, and a plurality of first logical circuits which are respectively provided corresponding to the plurality of registers and each of which generates an exclusive-OR signal of the external write data signal and an output signal of a corresponding register and outputs the generated exclusive-OR signal as the internal write data signal. In this case, a desired test pattern can be written into the plurality of memory cells by storing a plurality of data signals in the plurality of registers in a desired pattern.

More preferably, the internal expected value generating circuit includes a second logical circuit for generating an exclusive-OR signal of a read data signal from the predetermined memory cell and an output data signal from a register corresponding to the predetermined memory cell, and a plurality of third logical circuits which are respectively provided corresponding to the plurality of registers and each of which generates an exclusive-OR signal of the exclusive-OR signal generated in the second logical circuit and an output data signal of a corresponding register and outputs the generated exclusive-OR signal as the internal expected value signal. In this case, when the memory cell is normal, the logic level of the internal expected value signal would be the same as the logic level of the internal write data signal.

More preferably, the internal expected value generating circuit further includes a switching circuit for selecting one of the external expected value signal and the exclusive-OR signal generated in the second logical circuit according to a switching signal, and each of the plurality of third logical circuits generates an exclusive-OR signal of a signal selected by the switching circuit and an output data signal from a corresponding register and outputs the generated exclusive-OR signal as the internal expected value signal. In this case, when the test pattern is written without using the write mask function, a more accurate multi-bit test result can be obtained by selecting the external expected value signal.

More preferably, the determination circuit includes a plurality of sub-determination circuits which are respectively provided corresponding to the plurality of third logical circuits and each of which determines whether the logic level of a read data signal from a corresponding memory cell matches the logic level of an internal expected value signal output from a corresponding third logical circuit, and outputs a first signal when the logic levels match, and outputs a second signal when the logic levels do not match; and a determination result compressing circuit for outputting a signal of the first level when the first signal is output from all of the plurality of sub-determination circuits and for outputting a signal of the second level when the second signal is output from at least one of the plurality of sub-determination circuits. In this case, the determination circuit can be configured with ease.

More preferably, the semiconductor memory device has a function simultaneously to perform writing/reading of data signals of M×N (here, each of M and N is an integer greater than or equal to 2) memory cells designated by an address signal as well as a write mask function to inhibit rewriting of the data signals of the M×N memory cells per unit of write mask including N memory cells. The write data generating circuit generates M×N internal write data signals to be written into the M×N memory cells according to the external write data signal. The internal expected value generating circuit is provided corresponding to each unit of write mask for generating N internal expected value signals based on a read data signal from a predetermined memory cell among the corresponding N memory cells. The determination circuit is provided corresponding to each unit of write mask for determining whether logic levels of N read data signals from the corresponding N memory cells and logic levels of N internal expected value signals generated in the corresponding internal expected value generating circuit respectively match or not. In this case, a multi-bit test can be performed even when a test pattern is written using a write mask function for one unit of write mask of M units of write mask.

In addition, another semiconductor test circuit according to the present invention is a circuit for testing a semiconductor memory device having a function simultaneously to perform writing/reading of data signals of a plurality of memory cells designated by an address signal and having a write mask function to inhibit rewriting of data signals of the plurality of memory cells. The semiconductor test circuit is provided with a write data generating circuit for generating a plurality of internal write data signals to be written into the plurality of memory cells of one unit of write mask according to an external write data signal, a plurality of signal regeneration circuits which respectively receive a plurality of read data signals from the plurality of memory cells and each of which regenerates the external write data signal based on the received read data signal, and a determination circuit for determining whether the logic levels of a plurality of external write data signals regenerated by the plurality of signal regeneration circuits all match or not, and outputting a signal of a level according to a determination result. Thus, the plurality of external write data signals are regenerated based on the plurality of read data signals from the plurality of memory cells of one unit of write mask, and match/mismatch of the regenerated plurality of external write data signals is determined, so that the multi-bit test can be performed even when the test pattern is written using the write mask function.

Preferably, the write data generating circuit includes a plurality of registers each of which holds and outputs a data signal supplied in advance, and a plurality of first logical circuits which are respectively provided corresponding to the plurality of registers and each of which generates an exclusive-OR signal of the external write data signal and an output signal of a corresponding register and outputs the generated exclusive-OR signal as the internal write data signal. In this case, a desired test pattern can be written into the plurality of memory cells by storing a plurality of data signals in the plurality of registers in a desired pattern.

More preferably, the signal regeneration circuit includes a second logical circuit for generating an exclusive-OR signal of a read data signal from a corresponding memory cell and an output signal from a corresponding register and supplying the generated exclusive-OR signal as the external write data signal to the determination circuit. In this case, the external write data signal can be regenerated with ease.

More preferably, the semiconductor memory device has a function simultaneously to perform writing/reading of data signals of M×N (here, each of M and N is an integer greater than or equal to 2) memory cells designated by an address signal as well as a write mask function to inhibit rewriting of the data signals of the M×N memory cells per unit of write mask including N memory cells. The write data generating circuit generates M×N internal write data signals to be written into the M×N memory cells according to the external write data signal. The semiconductor test circuit includes M×N signal regeneration circuits corresponding to the M×N memory cells, respectively. Each of the signal regeneration circuits regenerates the external write data signal based on a read data signal from a corresponding memory cell. The determination circuit is provided corresponding to each unit of write mask for determining whether logic levels of N external write data signals regenerated by the corresponding N signal regeneration circuits all match or not. In this case, a multi-bit test can be performed even when a test pattern is written using a write mask function for one unit of write mask of M units of write mask.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a circuit diagram representing an arrangement of a determination circuit shown in FIG. 7.

FIG. 9 is a circuit diagram representing an arrangement of a determination result compressing circuit shown in FIG. 7.

FIGS. 10A and 10B are diagrams related to the description of an operation of a portion of the data generation/determination circuit shown in FIG. 6 related to the generation of the write data signal.

FIGS. 11A to 11C are diagrams related to the description of an operation of a portion of the data generation/determination circuit shown in FIG. 7 related to the determination of the read data signal.

FIGS. 12A to 12C are other diagrams related to the description of an operation of a portion of the data generation/determination circuit shown in FIG. 7 related to the determination of the read data signal.

FIGS. 13A to 13C are still further diagrams related to the description of an operation of a portion of the data generation/determination circuit shown in FIG. 7 related to the determination of the read data signal.

FIGS. 14A to 14C are even further diagrams related to the description of an operation of a portion of the data generation/determination circuit shown in FIG. 7 related to the determination of the read data signal.

DESCRIPTION OF THE PREFERRED EMBODIMENTS

First Embodiment

Figure 1:
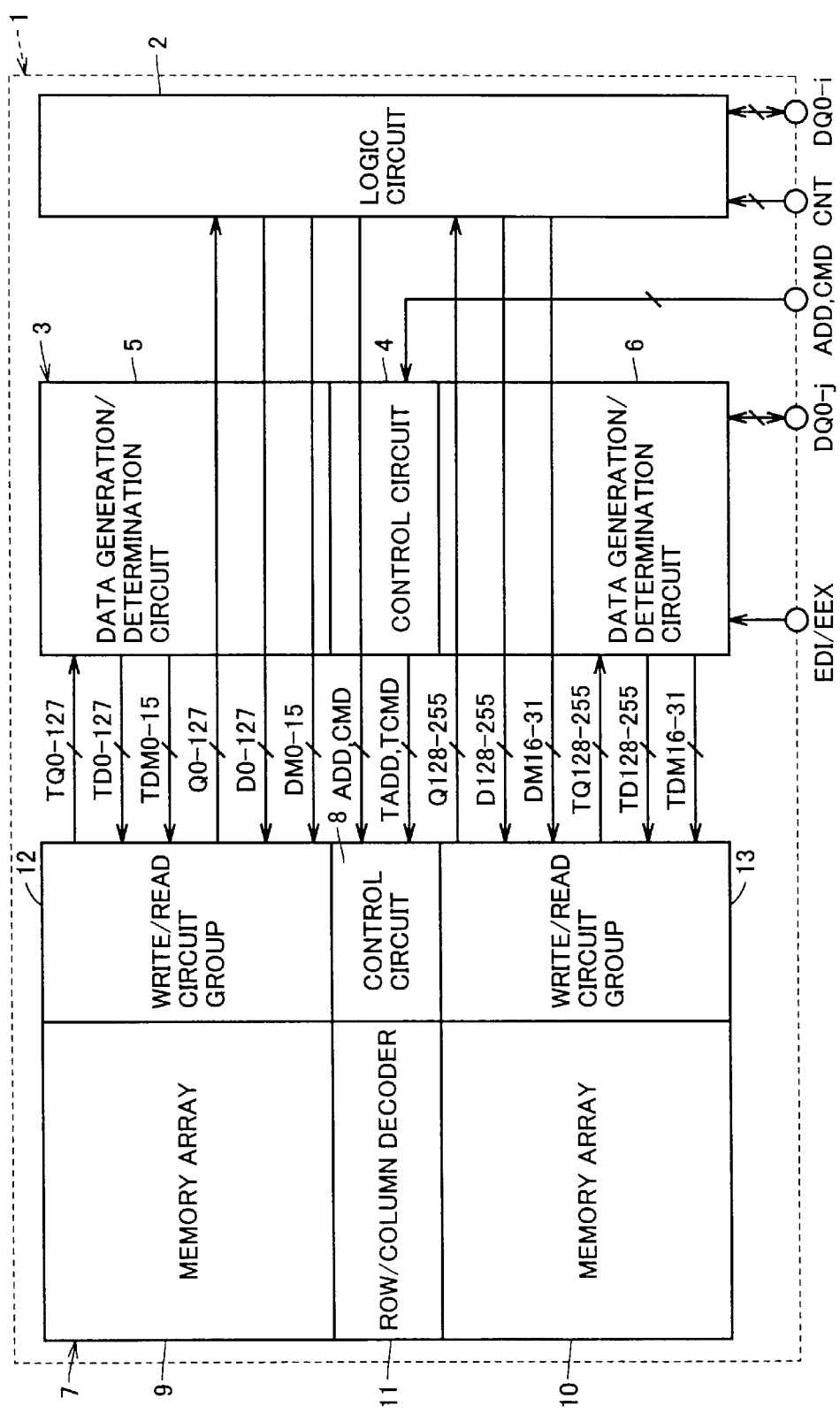
FIG. 1 is a block diagram representing an overall arrangement of a system LSI according to a first embodiment of the present invention.

FIG. 1 is a block diagram representing the arrangement of a system LSI 1 according to the first embodiment of the present invention. In FIG. 1, system LSI 1 is provided with a logic circuit 2, a test circuit 3, and an eDRAM 7.

Logic circuit 2 performs a prescribed logical operation according to an externally supplied control signal CNT and data signals D0 to Di (i is an integer greater than or equal to 0), and outputs to the outside data signals Q0 to Qi indicating an operation result during a normal operation. Logic circuit 2 supplies an address signal ADD and a command signal CMD to eDRAM 7 according to need, and reads data signals Q0 to Q255 from eDRAM 7. Moreover, logic circuit 2 supplies address signal ADD, command signal CMD, data signals D0 to D255, and write mask signals DM0 to DM31 to eDRAM 7 according to need, and rewrites a portion of the storage data of eDRAM 7.

Test circuit 3 tests whether each memory cell MC included in eDRAM 7 is normal or not and outputs a signal indicating a test result during a test operation. Thus, test circuit 3 includes a control circuit 4 and data generation/determination circuits 5, 6. Control circuit 4 generates a testing address signal TADD and a testing command signal TCMD and controls data generation/determination circuits 5, 6 according to externally supplied address signal ADD and command signal CMD and supplies the generated signals to eDRAM 7. Data generation/determination circuits 5, 6 generate testing write data signals TD0 to TD255 and write mask signals TDM0 to TDM31 and supplies the generated signals to eDRAM 7 according to externally supplied data signals EDI, D0 to Dj (j is an integer greater than or equal to 0), and a signal from control circuit 4.

Moreover, data generation/determination circuits 5, 6 determine whether each memory cell included in eDRAM 7 is normal or not and outputs to the outside signals Q0 to Qj of levels corresponding to the determination results according to externally supplied expected value EEX, read data signals DQ0 to DQ255 from eDRAM 7, and a signal from control circuit 4. Data generation/determination circuits 5, 6 will be described in detail later.

The eDRAM 7 is provided with a control circuit 8, memory arrays 9, 10, a row/column decoder 11, and write/read circuit groups 12, 13. Control circuit 8 controls the entire eDRAM 7 according to address signal ADD and command signal CMD from logic circuit 2 during the normal operation, and controls the entire eDRAM 7 according to address signal TADD and command signal TCMD from test circuit 3 during the test operation.

Memory arrays 9, 10 include a plurality of memory cells which are arranged in a matrix of rows and columns and each of which stores a data signal of one bit. The plurality of memory cells are divided into groups of 256 memory cells in advance, and a unique address signal is assigned to each group in advance.

Row/column decoder 11 selects one group from the plurality of memory cell groups according to address signal ADD (or TADD). During a write operation, write/read circuit groups 12, 13 write data signals D0 to D255 (or TD0 to TD255) respectively into 256 memory cells belonging to the group selected by row/column decoder 11, and during a read operation, read data signals Q0 to Q255 (or TQ0 to TQ255) respectively from 256 memory cells belonging to the group selected by row/column decoder 11. When write mask signals DM0 to DM31 (or TDM0 to TDM31) are caused to attain the active level or the "H" level, rewriting of data signals D0 to D7, . . . , D248 to D255 (or TD0 to TD7, . . . , TD248 to TD255), respectively, is inhibited.

Figure 2:
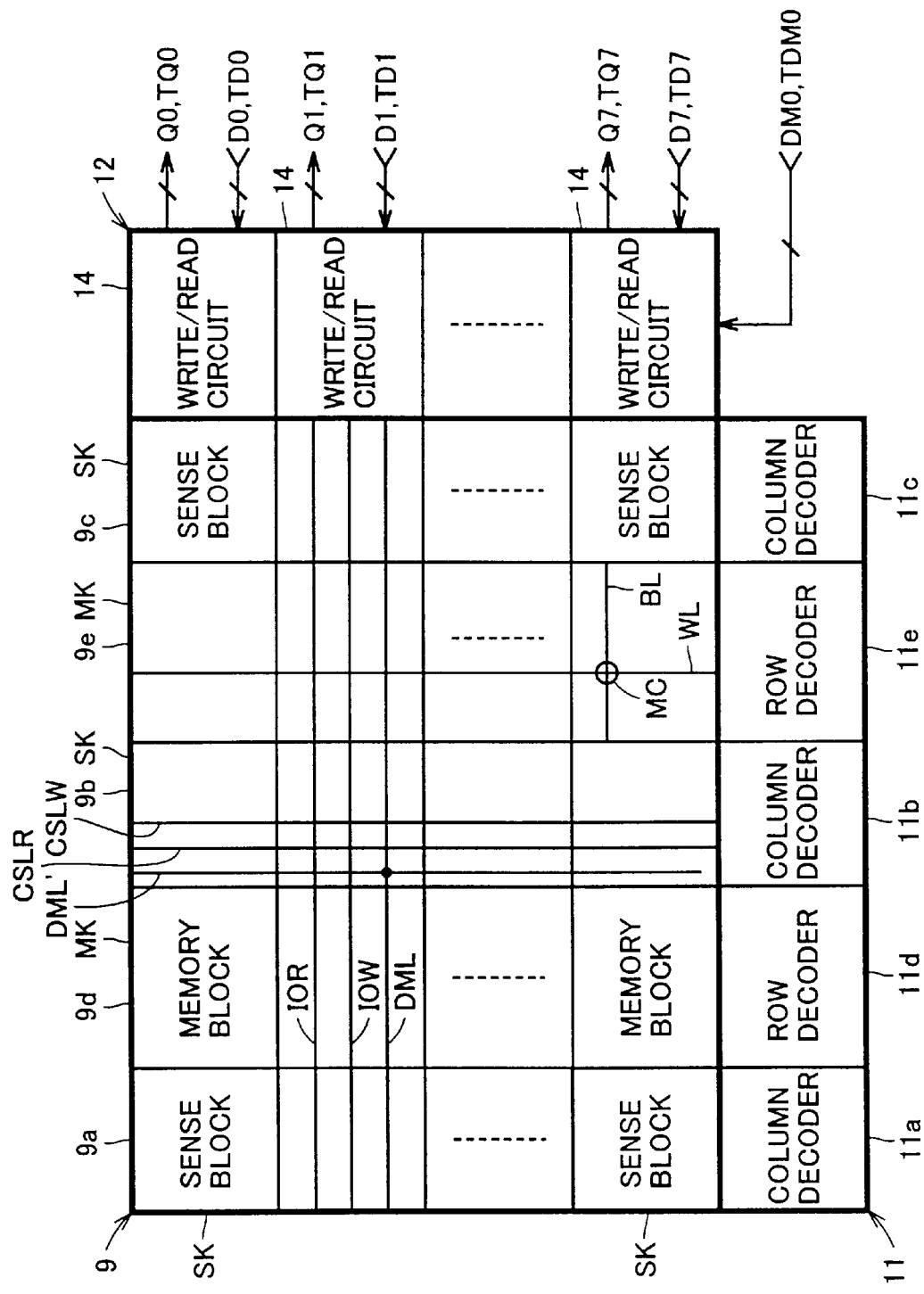
FIG. 2 is a block diagram showing in detail a partial arrangement of a memory array, a row/column decoder, and a write/read circuit group shown in FIG. 1.

FIG. 2 is a block diagram showing in more detail a portion of eDRAM 7 shown in FIG. 1 related to data signals DQ0 to DQ7.

In FIG. 2, memory array 9 is divided into a plurality of (three in the figure) sense amplifier bands 9a to 9c and two sub-arrays 9d, 9e disposed therebetween. Each of sense amplifier bands 9a, 9b, and 9c is divided into eight sense blocks SK respectively corresponding to data signals DQ0 to DQ7, and each of sub-arrays 9d, 9e is divided into eight memory blocks MK respectively corresponding to data signals DQ0 to DQ7.

Figure 3:
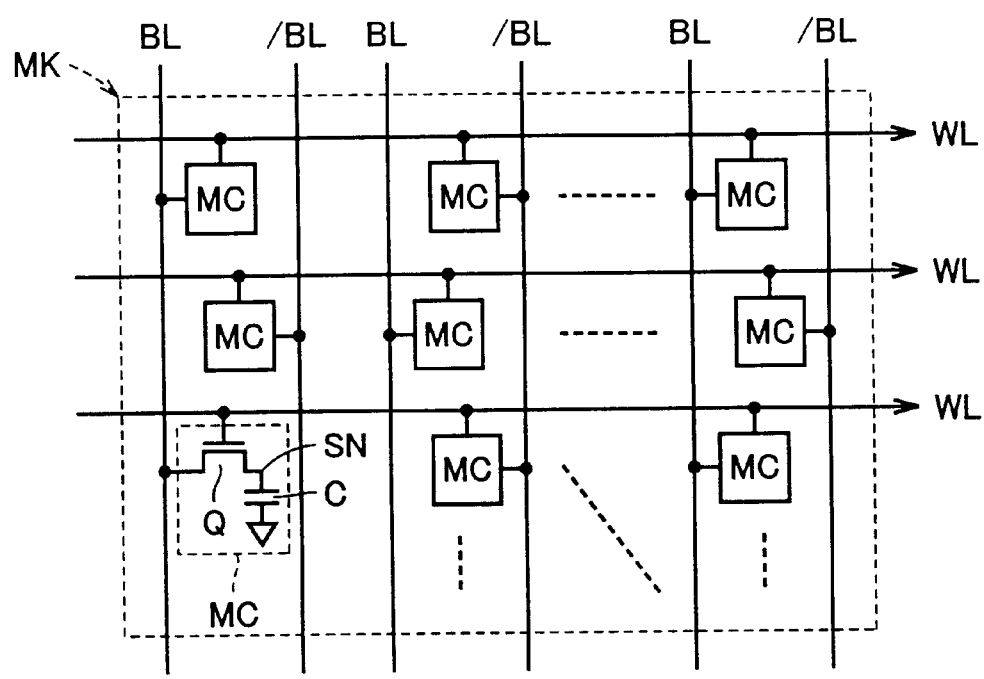
FIG. 3 is a circuit block diagram representing an arrangement of a memory block shown in FIG. 2.

As shown in FIG. 3, memory block MK includes a plurality of memory cells MC arranged in a matrix of rows and columns, a word line WL provided corresponding to each row, and a bit line pair BL, /BL provided corresponding to each column. Memory cell MC is of a well-known type which includes an accessing N-channel MOS transistor Q and a capacitor C for storage of information. When a word line WL rises to the select level or the "H" level, N-channel MOS transistor Q of each memory cell MC of the row corresponding to that word line WL is rendered conductive, and writing/reading of a data signal of each memory cell MC becomes possible.

Figure 4:
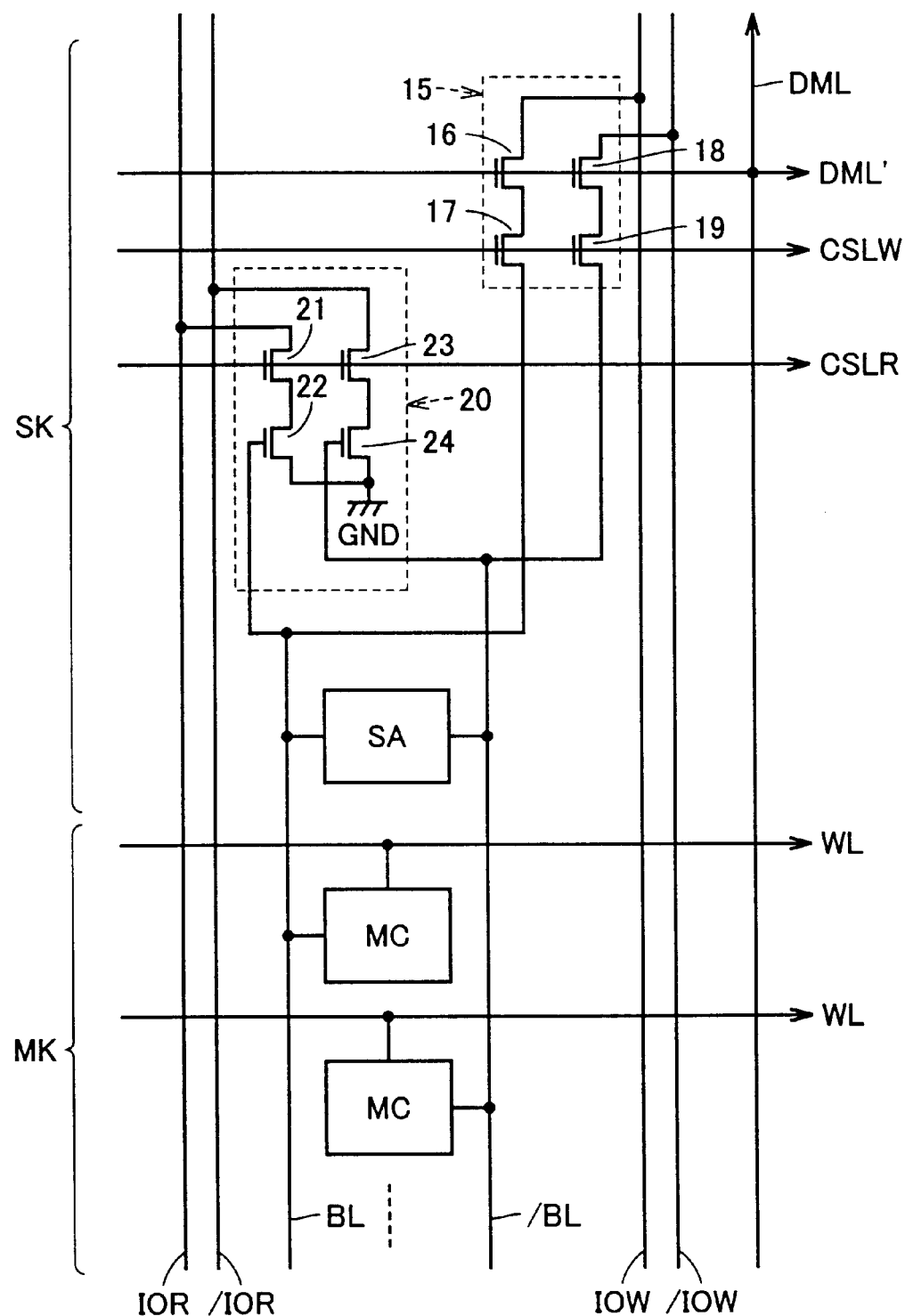
FIG. 4 is a circuit block diagram representing an arrangement of a sense block shown in FIG. 2.

As shown in FIG. 4, sense block SK includes a sub-write mask line DML', a sense amplifier SA provided corresponding to each bit line pair BL, /BL, a write-related column select gate 15, a write-related column select line CSLW, a read-related column select gate 20, and a read-related column select line CSLR. After the corresponding bit line pair BL, /BL is equalized to a bit line precharge potential VBL, sense amplifier SA amplifies to a power-supply voltage VCC a small potential difference that is generated between the corresponding bit line pair BL, /BL when the corresponding memory cell MC is activated.

Write-related column select gate 15 includes N-channel MOS transistors 16 to 19. N-channel MOS transistors 16, 17 are connected in series between a write data line IOW and a corresponding bit line BL, and N-channel MOS transistors 18, 19 are connected in series between a write data line /IOW and a corresponding bit line /BL. Gates of N-channel MOS transistors 16, 18 are connected to sub-write mask line DML', and gates of N-channel MOS transistors 17, 19 are connected to a corresponding write-related column select line CSLW.

When the corresponding write-related column select line CSLW is caused to attain the select level or the "H" level and sub-write mask line DML' is caused to attain the "H" level, N-channel MOS transistors 16 to 19 are rendered conductive and write data line pair IOW, /IOW is coupled to the corresponding bit line pair BL, /BL. When the corresponding write-related column select line CSLW is caused to attain the "L" level and sub-write mask line DML' is caused to attain the "H" level, N-channel MOS transistors 16, 18 are rendered conductive, while N-channel MOS transistors 17, 19 are rendered non-conductive, and thus write data line pair IOW, /IOW is cut off from the corresponding bit lines BL, /BL. When the corresponding write-related column select line CSLW is caused to attain the "H" level and sub-write mask line DML' is caused to attain the "L" level, N-channel MOS transistors 16, 18 are rendered non-conductive, while N-channel MOS transistors 17, 19 are rendered conductive, and thus write data line pair IOW, /IOW is cut off from the corresponding bit lines BL, /BL. When the corresponding write-related column select line CSLW and sub-write mask line DML' are both caused to attain the "L" level, N-channel MOS transistors 16, 17, 18, and 19 are all rendered non-conductive, and thus write data line pair IOW, /IOW is cut off from the corresponding bit lines BL, /BL.

Read-related column select gate 20 includes N-channel MOS transistors 21 to 24. N-channel MOS transistors 21, 22 are connected in series between a read data line IOR and a line of a ground potential GND. N-channel MOS transistors 23, 24 are connected in series between a read data line /IOR and the line of ground potential GND. Gates of N-channel MOS transistors 21, 23 are connected to read-related column select line CSLR, and gates of N-channel MOS transistors 22, 24 are respectively connected to the corresponding bit lines BL, /BL.

When the corresponding read-related column select line CSLR is caused to attain the select level or the "H" level, N-channel MOS transistors 21, 23 are rendered conductive. After read data line pair IOR, /IOR is precharged to the "H" level, and when sense amplifier SA causes bit lines BL, /BL respectively to attain the "H" level and the "L" level, N-channel MOS transistor 22 is rendered conductive, while N-channel MOS transistor 24 is rendered non-conductive, and thus read data line IOR is pulled down from the "H" level to the "L" level. In addition, when sense amplifier SA causes bit lines BL, /BL respectively to attain the "L" level and the "H" level, N-channel MOS transistor 24 is rendered conductive, while N-channel MOS transistor 22 is rendered non-conductive, and thus read data line /IOR is pulled down from the "H" level to the "L" level.

Returning to FIG. 2, row/column decoder 11 includes column decoders 11a, 11b, and 11c respectively provided corresponding to sense amplifier bands 9a, 9b, and 9c, and row decoders 11d, 11e respectively provided corresponding to sub-arrays 9d, 9e. Word line WL is provided in common to eight memory blocks MK included in one sub-array (for instance, 9e). According to a row address signal ADD supplied from control circuit 8, row decoders 11d, 11e select one of two sub-arrays 9d, 9e and one of a plurality of word lines WL included in the selected sub-array, and causes the selected word line WL to attain the select level or the "H" level and activates each memory cell MC corresponding to the selected word line WL.

Moreover, write-related column select line CSLW, read-related column select line CSLR, and sub-write mask line DML' are provided in common to eight sense blocks SK included in one sense amplifier band. According to a column address signal ADD supplied from control circuit 8, column decoders 11a, 11b, and 11c select one of three sense amplifier bands 9a, 9b, and 9c and one of a plurality of column select lines CSLW (or CSLR) disposed in the selected sense amplifier band, and causes the selected column select line CSLW (or CSLR) to attain the select level or the "H" level and renders the corresponding column select gate 15 (or 20) conductive.

Sense amplifier band 9b in the centre is shared by sub-arrays 9d, 9e on either side. Sense amplifier band 9b is coupled to the sub-array selected by row decoders 11d, 11e by a switch group (not shown). In addition, sense amplifier SA of sense block SK on one side of memory block MK is connected to an odd-numbered bit line pair BL, /BL of that memory block MK, and sense amplifier SA of sense block SK on the other side is connected to an even-numbered bit line pair BL, /BL of that memory block MK.

In addition, read data line pair IOR, /IOR, write data line pair IOW, /IOW, and a write mask line DML are provided corresponding to each of data signals DQ0 to DQ7, and are arranged such that they run across sense amplifier bands 9a to 9c and sub-arrays 9d, 9e. Write mask line DML and sub-write mask line DML' are connected together at the intersecting portion.

Figure 5:
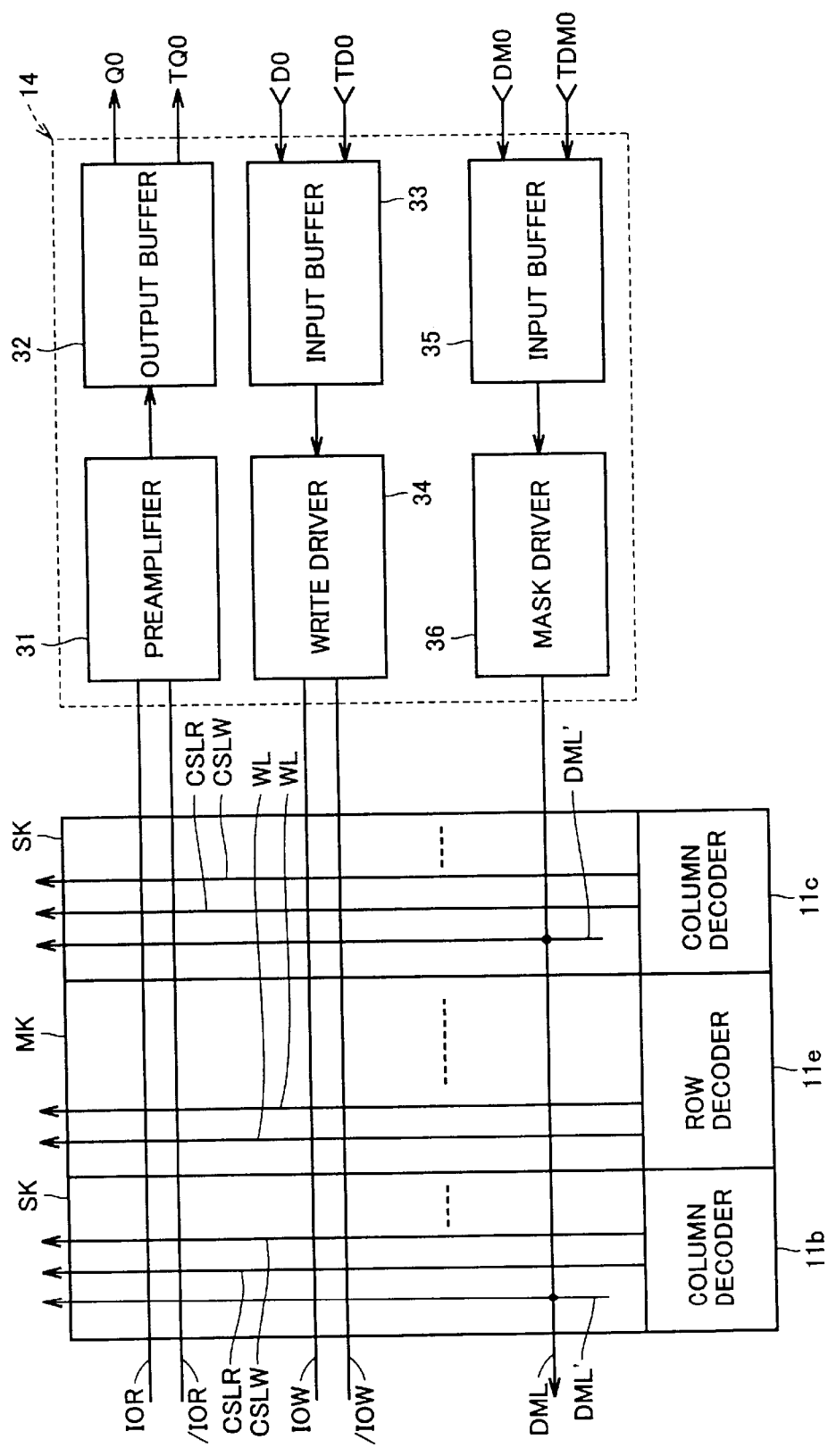
FIG. 5 is a block diagram representing an arrangement of a write/read circuit shown in FIG. 2.

A write/read circuit group 12 includes eight write/read circuits 14 corresponding to eight data signals DQ0 to DQ7, respectively. Write/read circuit 14 includes a preamplifier 31, an output buffer 32, input buffers 33, 35, a write driver 34, and a mask driver 36, as shown in FIG. 5.

Preamplifier 31 compares the potentials of the corresponding read data lines IOR and /IOR and supplies a signal of a level corresponding to a result of the comparison to output buffer 32 during a read operation. Output buffer 32 supplies the signal from preamplifier 31 as a data signal Q0 to logic circuit 2 during a normal operation, and supplies the signal from preamplifier 31 as a data signal TQ0 to test circuit 3 during a test operation.

Input buffer 33 receives a data signal D0 from logic circuit 2 and a data signal TD0 from test circuit 3, and supplies data signal D0 to write driver 34 during the normal operation, and supplies data signal TD0 to write driver 34 during the test operation. Write driver 34 causes one of the corresponding write data lines IOW and /IOW to attain the "H" level and the other to attain the "L" level according to data signal D0 (or TD0) from input buffer 33.

Input buffer 35 receives a write mask signal DM0 from logic circuit 2 and a write mask signal TDM0 from test circuit 3, and supplies write mask signal DM0 to mask driver 36 during the normal operation, and supplies write mask signal TDM0 to write driver 36 during the test operation. Mask driver 36 causes write mask line DML to attain the "L" level when write mask signal DM0 (or TDM0) from input buffer 35 is at the "H" level, and causes write mask line DML to attain the "H" level when write mask signal DM0 (or TDM0) is at the "L" level.

Now, an operation of the main portion of eDRAM 7 shown in FIGS. 2 to 5 will be briefly described. During the read operation, after each bit line pair BL, /BL is equalized to bit line precharge potential VBL=VCC/2, row decoders 11d, 11e cause a word line WL of a row corresponding to a row address signal ADD to rise to the select level or the "H" level, thereby rendering conductive an N-channel MOS transistor Q of a memory cell MC of that row. Consequently, the potential of bit lines BL, /BL changes by a very small amount according to the amount of electric charge of a capacitor C of the activated memory cell MC.

Thereafter, sense amplifier SA is activated. When the potential of bit line BL is slightly higher than the potential of bit lines /BL, the potential of bit line BL is pulled up to the "H" level, while the potential of bit line /BL is pulled down to the "L" level. Conversely, when the potential of bit line /BL is higher than the potential of bit line BL, the potential of bit line /BL is pulled up to the "H" level, while the potential of bit line BL is pulled down to the "L" level. When bit line BL attains the "H" level, N-channel MOS transistor 22 from N-channel MOS transistors 22, 24 is rendered conductive, and when bit line /BL attains the "H" level, N-channel MOS transistor 24 from N-channel MOS transistors 22, 24 is rendered conductive.

Thereafter, column decoders 11a to 11c cause a read-related column select line CSLR of a column corresponding to a column address signal ADD to rise to the select level or the "H" level, thereby rendering conductive N-channel MOS transistors 21, 23 of a read-related column select gate 20 of that column. Consequently, one of read data lines IOR and /IOR precharged to the "H" level in advance attains the "L" level. Write/read circuit 14 compares the potentials of read data lines IOR and /IOR, and supplies a data signal Q (or TQ) of a level corresponding to a result of the comparison to logic circuit 2 (or test circuit 3).

During a write operation, row decoders 11d, 11e cause a word line WL of a row corresponding to a row address signal ADD to rise to the "H" level, and sense amplifier SA is activated, thereby amplifying the potential difference between each bit line pair BL, /BL to a power-supply voltage VCC. Thus far, the operation is the same as in the read operation.

Thereafter, column decoders 11a to 11c cause a write-related column select line CSLW of a column corresponding to column address signal ADD to rise to the select level or the "H" level, thereby rendering conductive N-channel MOS transistors 17, 19 of a write-related column select gate 15 of that column. When write mask line DML is at the "H" level, N-channel MOS transistors 16, 18 of write-related column select gate 15 are also rendered conductive, and a bit line pair BL, /BL of that column is coupled to write-related data line pair IOW, /IOW via write-related column select gate 15. Write/read circuit 14 causes one of write-related data lines IOW and /IOW to attain the "H" level and the other to attain the "L" level according to a write data signal D (or TD). Capacitor C of the selected memory cell MC accumulates the charges of the amount corresponding to the potential of bit line BL or /BL. Moreover, when write mask line DML is at the "L" level, N-channel MOS transistors 16, 18 of write-related column select gate 15 are rendered non-conductive so that writing of a data signal of memory cell MC does not take place.

Data generation/determination circuits 5, 6 that characterize system LSI 1 will be described in detail below. For simplicity of the drawings and description, however, only the portion related to data signals TDQ0 to TDQ15 will be described.

Figure 6:
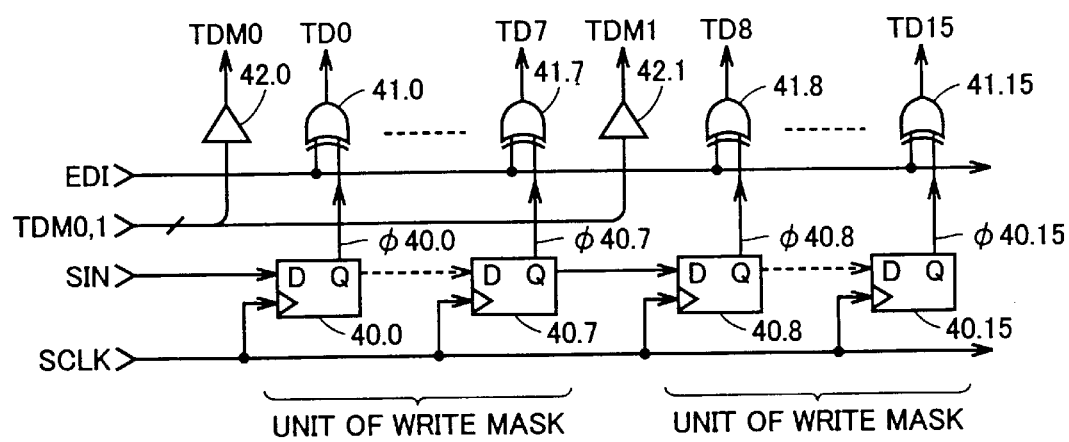
FIG. 6 is a circuit diagram showing a portion of a data generation/determination circuit shown in FIG. 1 related to generation of a write data signal.

FIG. 6 is a circuit diagram representing a portion related to the generation of data signals TD0 to TD15 of data generation/determination circuit 5 shown in FIG. 1. In FIG. 6, data generation/determination circuit 5 includes data scramble registers 40.0 to 40.15, EX-OR gates 41.0 to 41.15, and buffers 42.0, 42.1.

Registers 40.0 to 40.15 are connected in series to form a shift register. A clock signal SCLK is input to a clock terminal of each of registers 40.0 to 40.15. A data signal SIN is input to a data input terminal of register 40.0 of the initial stage. Each of registers 40.0 to 40.15 takes in an input data signal during a period in which clock signal SCLK is at the "L" level, in response to a rising edge of clock signal SCLK, and holds and outputs the data signal that was taken in. By changing the level of data signal SIN in synchronization with clock signal SCLK, a data signal of a desired logic level can be stored in each of registers 40.0 to 40.15. For instance, an "H" level data signal is stored in each of registers 40.0, 40.2, . . . , 40.14, while an "L" level data signal is stored in each of registers 40.1, 40.3, . . . , 40.15.

One input node of each of EX-OR gates 41.0 to 41.15 receives an external write data signal EDI, and the other input nodes of EX-OR gates 41.0 to 41.15 respectively receive output signals ϕ40.0 to ϕ40.15 from registers 40.0 to 40.15. Output signals from EX-OR gates 41.0 to 41.15 respectively become testing write data signals TD0 to TD15. Clock signal SCLK, data signal SIN, and write mask signals TDM0, TDM1 are generated inside test circuit 3 in response to external data signals D0 to Dj and a command signal CMD. Write mask signals TDM0, TDM1 are transmitted to eDRAM 7 via buffers 42.0, 42.1, respectively.

For instance, by storing an "H" level data signal in each of registers 40.0, 40.2, . . . , 40.14 and storing an "L" level data signal to each of registers 40.1, 40.3, . . . , 40.15, and by setting external write data signal EDI to the "H" level, each of write data signals TD0, TD2, . . . , TD14 can be made to attain the "L" level, while each of write data signals TD1, TD3, . . . , TD15 can be made to attain the "H" level. In addition, by keeping the levels of the data signals of registers 40.0 to 40.15 unchanged and setting external write data signal EDI to the "L" level, each of write data signals TD0, TD2, . . . , TD14 can be made to attain the "H" level, while each of write data signals TD1, TD3, . . . , TD15 can be made to attain the "L" level.

Moreover, by causing write mask signal TDM0 to attain the "H" level, the writing of data signals TD0 to TD7 can be inhibited, and by setting write mask signal TDM1 to the "H" level, the writing of data signals TD8 to TD15 can be inhibited.

Figure 7:
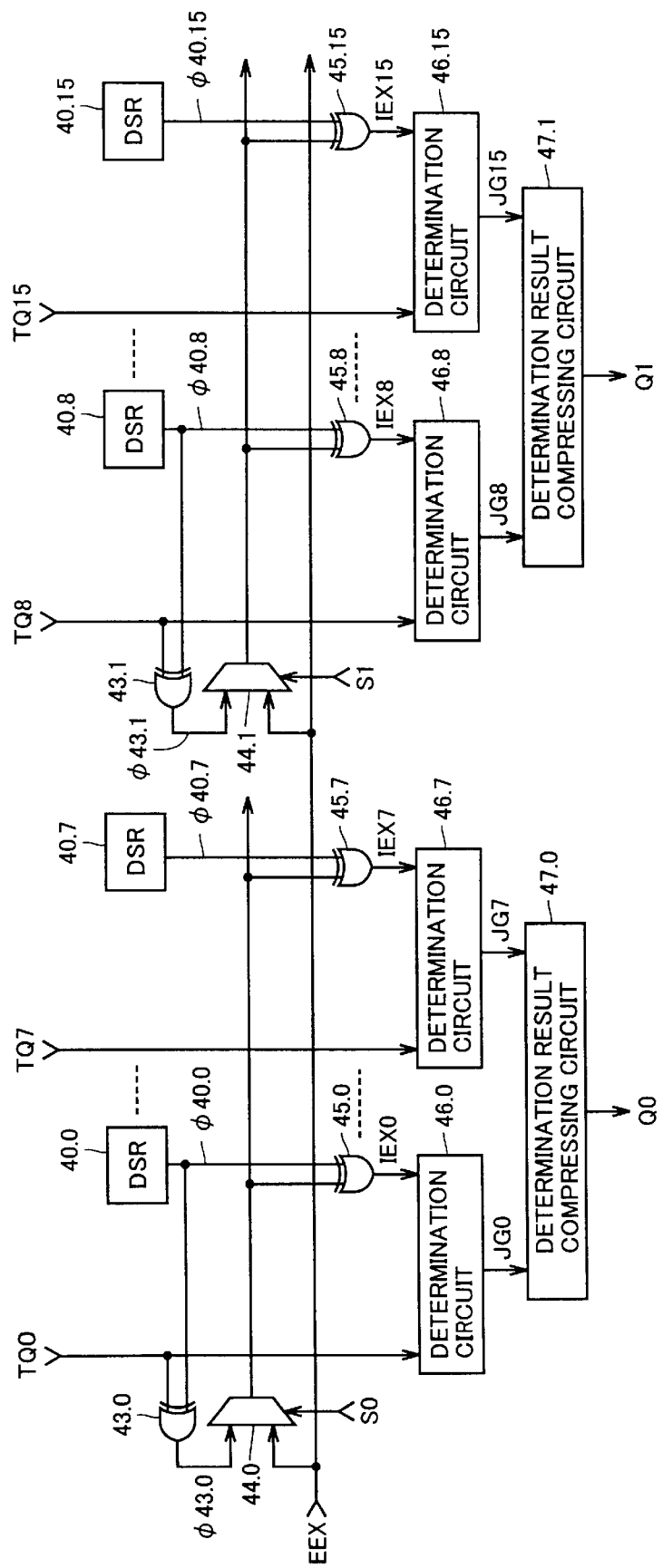
FIG. 7 is a circuit block diagram showing a portion of the data generation/determination circuit shown in FIG. 1 related to determination of a read data signal.

FIG. 7 is a circuit diagram showing a portion of data generation/determination circuit 5 shown in FIG. 1 related to the determination of data signals TQ0 to TQ15. In FIG. 7, data generation/determination circuit 5 includes EX-OR gates 43.0, 43.1, 45.0 to 45.15, selectors 44.0, 44.1, determination circuits 46.0 to 46.15, and determination result compressing circuits 47.0, 47.1 in addition to the circuit shown in FIG. 6.

EX-OR gate 43.0 receives a data signal TQ0 and an output signal ϕ40.0 from a register 40.0. Selector 44.0 receives an output signal from EX-OR gate 43.0 and an external expected value EEX, and supplies external expected value EEX to one input node of each of EX-OR gates 45.0 to 45.7 when a signal S0 is at the "L" level, and supplies the output signal from EX-OR gate 43.0 to one input node of each of EX-OR gates 45.0 to 45.7 when signal S0 is at the "H" level.

EX-OR gate 43.1 receives a data signal TQ8 and an output signal ϕ40.8 from a register 40.8. Selector 44.1 receives an output signal from EX-OR gate 43.1 and external expected value EEX, and supplies external expected value EEX to one input node of each of EX-OR gates 45.8 to 45.15 when a signal S1 is at the "L" level, and supplies the output signal from EX-OR gate 43.1 to one input node of each of EX-OR gates 45.8 to 45.15 when signal S1 is at the "H" level.

EX-OR gates 45.0 to 45.15 respectively output internal expected values IEX0 to IEX15. Determination circuits 46.0 to 46.15 respectively determine whether the logic levels of data signals TQ0 to TQ15 and internal expected values IEX0 to IEX15 match, and cause signals JG0 to JG15 to attain the "L" level that indicates that memory cells MC are normal when the logic levels match and cause signals JG0 to JG15 to attain the "H" level that indicates that a memory cell MC is defective when the logic levels do not match. Specifically, determination circuit 46.0 includes an EX-OR gate 48 that receives data signal TQ0 and internal expected value IEX0 and outputs signal JG0, as shown in FIG. 8. Other determination circuits 46.1 to 46.15 have the same arrangement as determination circuit 46.0.

Determination result compressing circuit 47.0 causes a signal Q0 to attain the "L" level that indicates that eight memory cells MC are normal when all of output signals JG0 to JG7 from determination circuits 46.0 to 46.7 are at the "L" level, and causes signal Q0 to attain the "H" level that indicates that at least one of eight memory cells MC is defective when even only one of signals JG0 to JG7 is at the "H" level.

Determination result compressing circuit 47.1 causes a signal Q1 to attain the "L" level that indicates that eight memory cells MC are normal when all of output signals JG8 to JG15 from determination circuits 46.8 to 46.15 are at the "L" level, and causes signal Q1 to attain the "H" level that indicates that at least one of eight memory cells MC is defective when even only one of signals JG8 to JG15 is at the "H" level.

FIG. 9 is a circuit diagram representing an arrangement of determination result compressing circuit 47.0. In FIG. 9, determination result compressing circuit 47.0 includes N-channel MOS transistors 51.0 to 51.7, 52.0 to 52.7; P-channel MOS transistors 53, 54; and inverters 55 to 57. The drains of N-channel MOS transistors 51.0 to 51.7 are all connected to a node N51, and their gates receive a multi-bit test enable signal ϕMBT. N-channel MOS transistors 52.0 to 52.7 are respectively connected between the sources of N-channel MOS transistors 51.0 to 51.7 and lines of ground potential GND, and gates of N-channel MOS transistors 52.0 to 52.7 respectively receive output signals JG0 to JG7 from determination circuits 46.0 to 46.7.

P-channel MOS transistors 53, 54 are connected in parallel between a line of a power-supply potential VCC and node N51. Inverter 55 inverts a signal ϕ51 that emerges on node N51 and supplies the inverted signal to a gate of P-channel MOS transistor 53. Inverter 56 inverts signal ϕMBT and supplies the inverted signal to a gate of P-channel MOS transistor 54. Inverter 57 inverts signal ϕ51 to generate signal Q0.

During a test operation, signal ϕMBT is set to the "H" level. Consequently, N-channel MOS transistors 51.0 to 51.7 and P-channel MOS transistor 54 are rendered conductive so that node N51 attains the "H" level, and P-channel MOS transistor 55 is rendered conductive, while at the same time, signal Q0 attains the "L" level. When signals JG0 to JG7 are all at the "L" level, N-channel MOS transistors 52.0 to 52.7 are rendered non-conductive, and signal Q0 remains unchanged at the "L" level. When at least one signal (for instance, JG0) out of signals JG0 to JG7 attains the "H" level, at least one (in this case, 52.0) of N-channel MOS transistors 52.0 to 52.7 is rendered conductive, and node N51 attains the "L" level so that signal Q0 attains the "H" level. Determination circuit 47.1 also has the same arrangement as determination circuit 47.0.

Now, an operation of data generation/determination circuit 5 shown in FIGS. 6 and 7 will be described. For simplicity of description, however, only the portion related to data signals TDQ0 to TDQ7 will be described. Moreover, the operation where an external expected value EEX is selected by selector 44.0 is the same as that in the conventional example so that the description thereof will not be repeated.

For instance, it is assumed that an "H" level data signal and an "L" level data signal are alternately stored in data scramble registers 40.0 to 40.7. In this case, as shown in FIG. 10A, output signals ϕ40.0, ϕ40.1, . . . , ϕ40.7 from registers 40.0, 40.1, . . . , 40.7 attain the "H" level, the "L" level, . . . , the "L" level, respectively.

In addition, there are four combinations of the logic levels of a write mask signal DM0 and an external write data signal EDI as shown in FIG. 10B: (1) DM0=L, EDI=H; (2) DM0=EDI=H; (3) DM0=EDI=L; and (4) DM0=H, EDI=L. When external write data signal EDI is set to the "H" level, data signals TD0 to TD7 alternately attain the "L" level and the "H" level. When external write data signal EDI is set to the "L" level, data signals TD0 to TD7 alternately attain the "H" level and the "L" level. In a case where write mask signal DM0 is at the "H" level, however, the writing of data signals TD0 to TD7 does not take place.

For instance, after data signals TD0 to TD7 are written into all the addresses in the state (1) (DM0=L, EDI=H), and when the state (3) (DM0=EDI=L) and the state (4) (DM0=H, EDI=L) are repeatedly alternated, the data signals of the address corresponding to the state (3) would be rewritten, but rewriting of the data signals of the address corresponding to the state (4) would not take place.

In such a case, if the determination of read data signals TQ0 to TQ7 is performed using the same method as in the conventional example, data signals of the address corresponding to the state (4) and an expected value EEX would not match regardless of whether memory cells MC are normal or not. With data generation/determination circuit 5, however, accurate determination can be performed even in such a case.

FIGS. 11A to 11C are diagrams showing an operation of data generation/determination circuit 5 in the case where eight memory cells MC0 to MC7 corresponding to data signals TDQ0 to TDQ7 are all normal. For simplicity of description, only the operation related to data signals TDQ0 and TDQ7 will be described. As shown in FIG. 11A, it is assumed that output signals φ40.0, φ40.7 of data scramble registers 40.0, 40.7 are set to different logic levels from one another. Write data signals TD0, TD7 are exclusive-OR signals of external write data signal EDI and signals φ40.0, φ40.7, respectively.

When the writing of data signals TD0 to TD7 is performed with write mask signal DM0 maintained at the "L" level, as shown in FIG. 11B, the logic levels of read data signals TQ0, TQ7 become the same as the logic levels of write data signals TD0, TD7, respectively. In this case, signal S0 is caused to attain the "L" level, and expected value EEX is supplied to EX-OR gates 45.0 to 45.7 via selector 44.0. The logic level of expected value EEX is set to the same logic level as external write data signal EDI during the writing of data signals TD0, TD7. Internal expected values IEX0, IEX7 become exclusive-OR signals of output signals φ40.0, φ40.7 from registers 40.0, 40.7 and expected value EEX, respectively. Consequently, the logic levels of internal expected values IEX0, IEX7 become the same as the logic levels of write data signals TD0, TD7, respectively. Thus, output signals JG0, JG7 from determination circuits 46.0, 46.7 both attain the "L" level, and output signal Q0 from determination result compressing circuit 47.0 attains the "L" level that indicates that eight memory cells MC0 to MC7 are normal.

When write mask signal DM0 is set to the "H" level and the writing of data signals TD0 to TD7 is not performed, as shown in FIG. 11C, the logic levels of read data signals TQ0, TQ7 respectively become the complementary levels of the logic levels of write data signals TD0, TD7 shown in FIG. 11A. In this case, signal S0 is caused to attain the "H" level, and an output signal φ43.0 from EX-OR gate 43.0 is supplied to EX-OR gates 45.0 to 45.7 via selector 44.0. Signal φ43.0 is a signal obtained by twice subjecting external write data signal EDI to exclusive-OR operation (EX-OR gates 41.0, 43.0) so that the logic levels of signal φ43.0 and signal EDI become the same. Therefore, the logic levels of internal expected values IEX0, IEX7 become the same as the logic levels of write data signals TD0, TD7 at the time when write mask signal DM0 is at the "L" level. Consequently, output signals JG0, JG7 from determination circuits 46.0, 46.7 both attain the "L" level, and output signal Q0 from determination result compressing circuit 47.0 attains the "L" level that indicates that eight memory cells MC0 to MC7 are normal.

FIGS. 12A to 12C are diagrams showing an operation of a data generation/determination circuit 5 in a case where, among eight memory cells MC0 to MC7 corresponding to data signals TDQ0 to TDQ7, a memory cell MC0 corresponding to data signal TD0 is defective and other memory cells MC1 to MC7 are normal. The writing of data signals TD0 to TD7 is performed using the same method as that shown in FIG. 11A. Thus, FIG. 12A is the same as FIG. 11A.

FIG. 12B differs from FIG. 11B in that read data signal TQ0 is an inverted signal of write data signal TD0 since memory cell MC0 corresponding to data signal TDQ0 is defective. Consequently, output signals JG0, JG7 from determination circuits 46.0, 46.7 respectively attain the "H" level and the "L" level, and output signal Q0 from determination result compressing circuit 47.0 attains the "H" level that indicates that at least one of eight memory cells MC0 to MC7 is defective.

FIG. 12C differs from FIG. 11C in that the logic levels of signals TQ0, φ43.0, IEX0, and IEX7 are the complementary levels of the logic levels of signals TQ0, φ43.0, IEX0, and IEX7 in FIG. 11C since memory cell MC0 corresponding to data signal TDQ0 is defective. Consequently, output signals JG0, JG7 from determination circuits 46.0, 46.7 respectively attain the "L" level and the "H" level, and output signal Q0 from determination result compressing circuit 47.0 attains the "H" level that indicates that at least one of eight memory cells MC0 to MC7 is defective.

FIGS. 13A to 13C are diagrams showing an operation of data generation/determination circuit 5 in a case where, among eight memory cells MC0 to MC7 corresponding to data signals TDQ0 to TDQ7, a memory cell MC0 corresponding to data signal TD0 is normal and the other memory cells MC1 to MC7 are defective. The writing of data signals TD0, TD7 is performed using the same method as that shown in FIG. 11A. Therefore, FIG. 13A is the same as FIG. 11A.

FIG. 13B differs from FIG. 11B in that read data signal TQ7 is an inverted signal of write data signal TD7 since a memory cell MC7 corresponding to data signal TDQ7 is defective. Consequently, output signals JG0, JG7 from determination circuits 46.0, 46.7 respectively attain the "L" level and the "H" level, and output signal Q0 from determination result compressing circuit 47.0 attains the "H" level that indicates that at least one of eight memory cells MC0 to MC7 is defective.

FIG. 13C differs from FIG. 11C in that the logic level of signal TQ7 is a complementary level of the logic level of signal TQ7 in FIG. 11C since memory cell MC7 corresponding to data signal TDQ7 is defective. Consequently, output signals JG0, JG7 from determination circuits 46.0, 46.7 respectively attain the "L" level and the "H" level, and output signal Q0 from determination result compressing circuit 47.0 attains the "H" level that indicates that at least one of eight memory cells MC0 to MC7 is defective.

FIGS. 14A to 14C are diagrams showing an operation of data generation/determination circuit 5 in a case where eight memory cells MC0 to MC7 corresponding to data signals TDQ0 to TDQ7 are all defective. The writing of data signals TD0, TD7 is performed using the same method as that shown in FIG. 11A. Therefore, FIG. 14A is the same as FIG. 11A.

FIG. 14B differs from FIG. 11B in that read data signals TQ0, TQ7 are inverted signals of write data signals TD0, TD7 since memory cells MC0, MC7 corresponding to data signals TDQ0, TDQ7 are defective. Consequently, output signals JG0, JG7 from determination circuits 46.0, 46.7 both attain the "H" level, and output signal Q0 from determination result compressing circuit 47.0 attains the "H" level that indicates that at least one of eight memory cells MC0 to MC7 is defective.

FIG. 14C differs from FIG. 11C in that the logic levels of signals TQ0, TQ7, φ43.0, IEX0, and IEX7 are the complimentary levels of the logic levels of signals TQ0, TQ7, φ43.0, IEX0, and IEX7 in FIG. 11C since memory cells MC0, MC7 corresponding to data signals TDQ0, TDQ7 are defective. Consequently, output signals JG0, JG7 from determination circuits 46.0, 46.7 both attain the "L" level, and output signal Q0 from determination result compressing circuit 47.0 attains the "L" level that indicates that eight memory cells MC0 to MC7 are all normal. Thus, the case where eight memory cells MC0 to MC7 are all defective cannot be distinguished from the case where eight memory cells MC0 to MC7 are all normal; however, the case in which eight memory cells MC0 to MC7 are all defective is extremely rare.

In the first embodiment, eight internal expected values IEX0 to IEX7 are generated based on a prescribed read data signal TQ0 among eight read data signals TQ0 to TQ7, and the match/mismatch of read data signals TQ0 to T07 and internal expected values IEX0 to IEX7 is determined per unit of write mask. Therefore, a multi-bit test can be performed even when a test pattern is written using the write mask function.

In addition, in the first embodiment, although signals EDI, EEX, DQ0 to DQj, ADD, and CMD are supplied to test circuit 3 using external pins for testing, these signals EDI, EEX, DQ0 to DQj, ADD, and CMD may be supplied to test circuit 3 by logic circuit 2.

Second Embodiment

Figure 15:
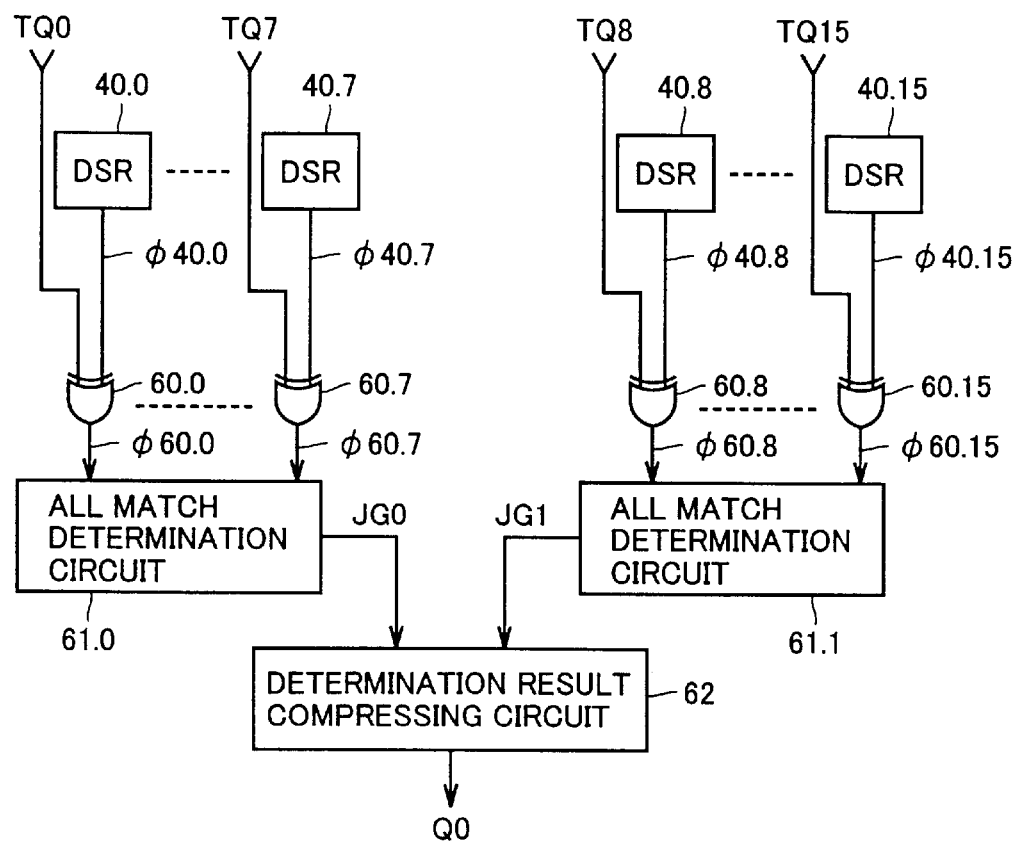
FIG. 15 is a circuit block diagram representing a portion, related to the determination of a read data signal, of a data generation/determination circuit included in a system LSI according to a second embodiment of the present invention.

FIG. 15 is a circuit block diagram representing a portion, related to the determination of read data signals DQ0 to DQ15, of a data generation/determination circuit is the same as that included in a system LSI according to the second embodiment of the present invention. The portion related to the generation of data signals TD0 to TD15 of this data generation/determination circuit is the same as that shown in FIG. 6.

In FIG. 15, the data generation/determination circuit includes EX-OR gates 60.0 to 60.15, all match determination circuits 61.0, 61.1, and a determination result compressing circuit 62 in addition to data scramble registers 40.0 to 40.15. EX-OR gates 60.0 to 60.15 are respectively provided with read data signals TQ0 to TQ15 at their respective one input node. Output signals φ40.0 to φ40.15 from data scramble registers 40.0 to 40.15 are respectively input to the other input nodes of EX-OR gates 60.0 to 60.15.

All match determination circuit 61.0 determines whether the logic levels of output signals φ60.0 to φ60.7 from EX-OR gates 60.0 to 60.7 match or not, and when they match, causes a signal JG0 to attain the "H" level that indicates that eight memory cells MC0 to MC7 corresponding to read data signals TQ0 to TQ7 are normal, and when they do not match, causes signal JG0 to attain the "L" level that indicates that at least one of eight memory cells MC0 to MC7 is defective.

Figure 16:
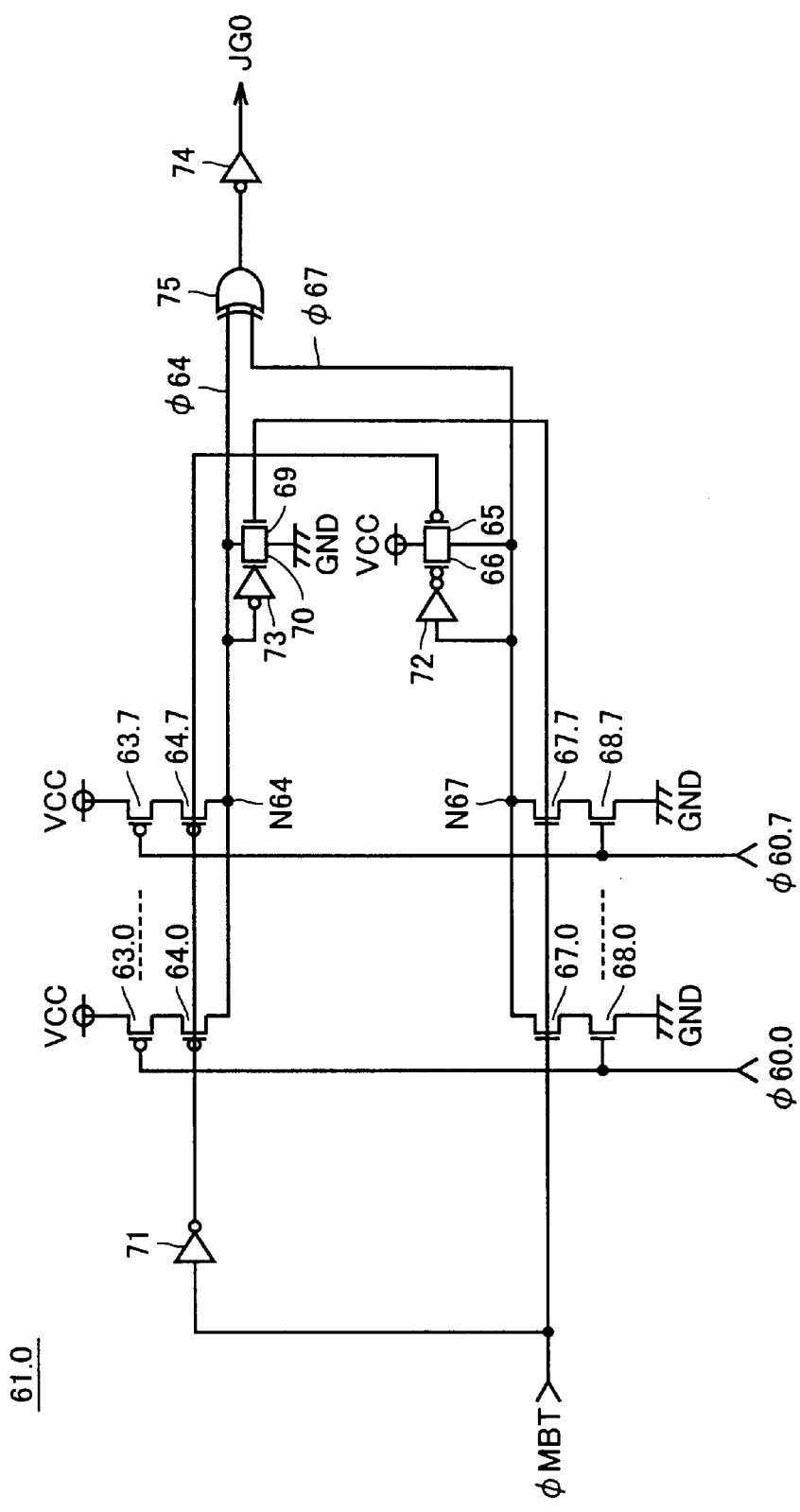
FIG. 16 is a circuit diagram representing an arrangement of an all match determination circuit shown in FIG. 15.
Figure 17A:
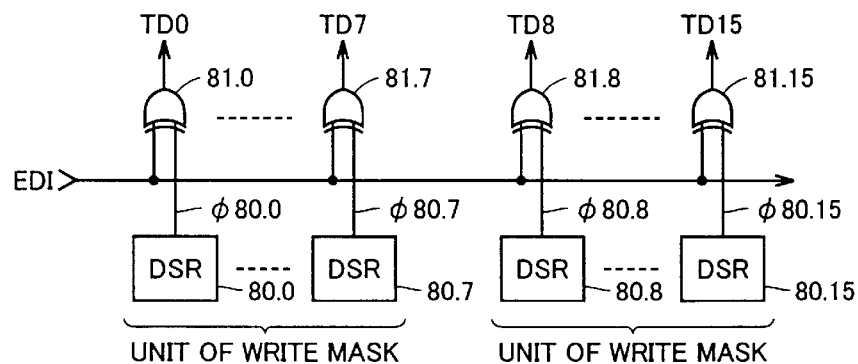
FIGS. 17A and 17B are circuit block diagrams showing the main portion of a data generation/determination circuit of a conventional system LSI.
Figure 17B:
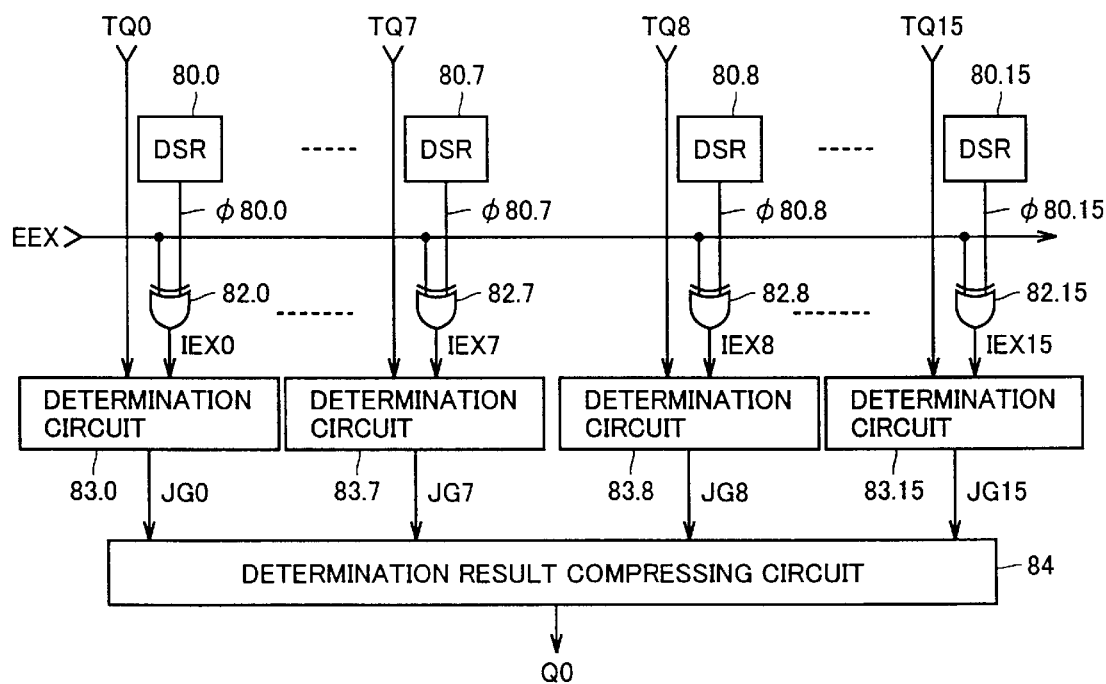

In other words, all match determination circuit 61.0 includes P-channel MOS transistors 63.0 to 63.7, 64.0 to 64.7, 65, and 66; N-channel MOS transistors 67.0 to 67.7, 68.0 to 68.7, 69, and 70; inverters 71 to 74; and an EX-OR gate 75, as shown in FIG. 16. The sources of P-channel MOS transistors 63.0 to 63.7 are all connected to lines of power-supply potential VCC, and their gates respectively receive output signals φ60.0 to φ60.7 from EX-OR gates 60.0 to 60.7. P-channel MOS transistors 64.0 to 64.7 are respectively connected between the drains of P-channel MOS transistors 63.0 to 63.7 and a node N64.

The sources of N-channel MOS transistors 68.0 to 68.7 are all connected to lines of ground potential GND, and their gates respectively receive output signals φ60.0 to φ60.7 from EX-OR gates 60.0 to 60.7. N-channel MOS transistors 67.0 to 67.7 are respectively connected between the drains of N-channel MOS transistors 68.0 to 68.7 and a node N67.

N-channel MOS transistors 69, 70 are connected in parallel between node N64 and a line of ground potential GND. P-channel MOS transistors 65, 66 are connected in parallel between a line of power-supply potential VCC and node N67. A multi-bit test enable signal φMBT is input to gates of P-channel MOS transistors 64.0 to 64.7, and 65 via inverter 71, and is also directly input to the gates of N-channel MOS transistors 67.0 to 67.7, and 69. A signal φ64 that emerges on node N64 is input to a gate of N-channel MOS transistor 70 via inverter 73 and is also input directly to one input node of EX-OR gate 75. A signal φ67 that emerges on node N67 is input to a gate of N-channel MOS transistor 66 via inverter 72 and is also directly input to the other input node of EX-OR gate 75. An output signal from EX-OR gate 75 is inverted by inverter 74, and becomes an output signal JG0 of all match determination circuit 61.0.

When signal φMBT is caused to attain the active level or the "H" level, P-channel MOS transistors 64.0 to 64.7, and 65 and N-channel MOS transistors 67.0 to 67.7, and 69 are rendered conductive, and nodes N64, N67 respectively attain the "L" level and the "H" level. Accordingly, N-channel MOS transistor 70 and P-channel MOS transistor 66 are also rendered conductive.

When signals φ60.0 to φ60.7 are all at the "H" level, P-channel MOS transistors 63.0 to 63.7 are rendered non-conductive, while N-channel MOS transistors 68.0 to 68.7 are rendered conductive, and node N64 remains unchanged at the "L" level, while node N67 falls to the "L" level. Consequently, signal JG0 attains the "H" level.

When signals φ60.0 to φ60.7 are all at the "L" level, P-channel MOS transistors 63.0 to 63.7 are rendered conductive, while N-channel MOS transistors 68.0 to 68.7 are rendered non-conductive, and node N67 remains unchanged at the "H" level, while node N64 is raised to the "H" level. Consequently, signal JG0 attains the "H" level.

When at least one signal (for instance, φ60.0) of signals φ60.0 to φ60.7 is at the "H" level while other signals (in this case, φ60.1 to φ60.7) are at the "L" level, N-channel MOS transistor 68.0 and P-channel MOS transistors 63.1 to 63.7 are rendered conductive, and nodes N64, N67 respectively attain the "H" level and the "L" level. Consequently, signal JG0 attains the "L" level.

Returning to FIG. 15, all match determination circuit 61.1 determines whether the logic levels of output signals φ60.8 to φ60.15 from EX-OR gates 60.8 to 60.15 match or not, and when they match, causes a signal JG1 to attain the "H" level that indicates that eight memory cells MC8 to MC15 corresponding to read data signals TQ8 to TQ15 are normal, and when they do not match, causes signal JG1 to attain the "L" level that indicates that at least one of eight memory cells MC8 to MC15 is defective.

A determination result compressing circuit 62 receives output signals JG0, JG1 from all match determination circuits 61.0, 61.1, and when signals JG0, JG1 are both at the "H" level, causes a signal Q0 to attain the "H" level that indicates that 16 memory cells MC0 to MC15 are normal, and when at least one of signals JG0, JG1 is at the "L" level, causes signal Q0 to attain the "L" level that indicates that at least one of 16 memory cells MC0 to MC15 is defective.

Now, an operation of the data generation/determination circuit shown in FIGS. 15 and 16 will be described. For instance, when a memory cell MC0 corresponding to output signal φ60.0 from EX-OR gate 60.0 is normal, signal φ60.0 is a signal obtained by twice subjecting external write data signal EDI to exclusive-OR operation (EX-OR gates 41.0, 60.0). Therefore, the logic level of signal φ60.0 would be the same as the logic level of external write data signal EDI upon a write operation if no write mask is performed during the write operation, and would be the same as the logic level of external write data signal EDI from the previous write operation if the write mask is performed during the write operation.

Thus, when eight memory cells MC0 to MC7 are all normal, the logic levels of output signals φ60.0 to φ60.7 from EX-OR gates 60.0 to 60.7 become the same, and output signal JG0 from all match determination circuit 61.0 attains the "H" level. Similarly, when eight memory cells MC8 to MC15 are all normal, the logic levels of output signals φ60.8 to φ60.15 from EX-OR gates 60.8 to 60.15 become the same, and output signal JG1 from all match determination circuit 61.1 attains the "H" level. Therefore, when 16 memory cells MC0 to MC15 are all normal, output signal Q0 from determination result compressing circuit 62 attains the "H" level.

Moreover, when at least one of eight memory cells MC0 to MC7 is defective, the logic levels of output signals φ60.0 to φ60.7 from EX-OR gates 60.0 to 60.7 do not match, and output signal JG0 from all match determination circuit 61.0 attains the "L" level. Similarly, when at least one of eight memory cells MC8 to MC15 is defective, the logic levels of output signals φ60.8 to φ60.15 from EX-OR gates 60.8 to 60.15 do not match, and output signal JG1 from all match determination circuit 61.1 attains the "L" level. Consequently, when at least one of 16 memory cells MC0 to MC15 is defective, output signal Q0 from determination result compressing circuit 62 attains the "L" level.

Furthermore, output signal Q0 from determination result compressing circuit 62 attains the "H" level also when 8 memory cells MC0 to MC7 or MC8 to MC15 are all defective; however, such a case is extremely rare.

In the second embodiment, signals φ60.0 to φ60.15 that are to attain the same logic level as external write data signal EDI are generated based on external write data signals TQ0 to TQ15, and the match/mismatch of the logic levels of signals φ60.0 to φ60.7, φ60.8 to φ60.15 is determined per unit of write mask. Thus, a multi-bit test can be performed even when a test pattern is written using a write mask signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor test circuit for testing a semiconductor memory device having a function simultaneously to perform writing/reading of data signals of a plurality of memory cells designated by an address signal and having a write mask function to inhibit rewriting of the data signals of said plurality of memory cells, comprising:

a write data generating circuit for generating a plurality of internal write data signals to be written into said plurality of memory cells according to an external write data signal;

an internal expected value generating circuit for generating a plurality of internal expected value signals based on a read data signal from a predetermined memory cell among said plurality of memory cells; and a determination circuit for determining whether logic levels of a plurality of read data signals from said plurality of memory cells and logic levels of said plurality of internal expected value signals generated in said internal expected value generating circuit respectively match or not, and outputting a signal of a first level when the logic levels match in all respective pairs, and outputting a signal of a second level when the logic levels do not match at least in one pair.

2. The semiconductor test circuit according to claim 1, wherein said write data generating circuit includes a plurality of registers each of which holds and outputs a data signal supplied in advance, and a plurality of first logical circuits which are respectively provided corresponding to said plurality of registers and each of which generates an exclusive-OR signal of said external write data signal and an output signal of a corresponding register and outputs generated exclusive-OR signal as said internal write data signal.

3. The semiconductor test circuit according to claim 2, wherein said internal expected value generating circuit includes a second logical circuit for generating an exclusive-OR signal of a read data signal from said predetermined memory cell and an output data signal from a register corresponding to said predetermined memory cell, and a plurality of third logical circuits which are respectively provided corresponding to said plurality of registers and each of which generates an exclusive-OR signal of the exclusive-OR signal generated in said second logical circuit and an output data signal of a corresponding register and outputs generated exclusive-OR signal as said internal expected value signal.

4. The semiconductor test circuit according to claim 3, wherein said internal expected value generating circuit further includes a switching circuit for selecting one of the external expected value signal and the exclusive-OR signal generated in said second logical circuit according to a switching signal, and each of said plurality of third logical circuits generates an exclusive-OR signal of a signal selected by said switching circuit and an output data signal from a corresponding register and outputs generated exclusive-OR signal as said internal expected value signal.

5. The semiconductor test circuit according to claim 3, wherein said determination circuit includes a plurality of sub-determination circuits which are respectively provided corresponding to said plurality of third logical circuits and each of which determines whether a logic level of a read data signal from a corresponding memory cell matches a logic level of an internal expected value signal output from a corresponding third logical circuit, and outputs a first signal when the logic levels match, and outputs a second signal when the logic levels do not match, and a determination result compressing circuit for outputting a signal of said first level when said first signal is output from all of said plurality of sub-determination circuits and for outputting a signal of said second level when said second signal is output from at least one of said plurality of sub-determination circuits.

6. The semiconductor test circuit according to claim 1, wherein said semiconductor memory device has a function simultaneously to perform writing/reading of data signals of M×N (each of M and N is an integer greater than or equal to 2) memory cells designated by an address signal as well as a write mask function to inhibit rewriting of the data signals of said M×N memory cells per unit of write mask including N memory cells, said write data generating circuit generates M×N internal write data signals to be written into said M×N memory cells according to said external write data signal, said internal expected value generating circuit is provided corresponding to each unit of write mask for generating N internal expected value signals based on a read data signal from a predetermined memory cell among corresponding N memory cells, and said determination circuit is provided corresponding to each unit of write mask for determining whether logic levels of N read data signals from the corresponding N memory cells and logic levels of N internal expected value signals generated in a corresponding internal expected value generating circuit respectively match or not.

7. A semiconductor test circuit for testing a semiconductor memory device having a function simultaneously to perform writing/reading of data signals of a plurality of memory cells designated by an address signal and having a write mask function to inhibit rewriting of the data signals of said plurality of memory cells, comprising:

a write data generating circuit for generating a plurality of internal write data signals to be written into said plurality of memory cells according to an external write data signal;

a plurality of signal regeneration circuits which respectively receive a plurality of read data signals from said plurality of memory cells and each of which regenerates said external write data signal based on received read data signal; and a determination circuit for determining whether logic levels of a plurality of external write data signals regenerated by said plurality of signal regeneration circuits all match or not, and outputting a signal of a level according to a determination result.

8. The semiconductor test circuit according to claim 7, wherein said write data generating circuit includes a plurality of registers each of which holds and outputs a data signal supplied in advance, and a plurality of first logical circuits which are respectively provided corresponding to said plurality of registers and each of which generates an exclusive-OR signal of said external write data signal and an output signal of a corresponding register and outputs a generated exclusive-OR signal as said internal write data signal.

9. The semiconductor test circuit according to claim 8, wherein said signal regeneration circuit includes a second logical circuit for generating an exclusive-OR signal of a read data signal from a corresponding memory cell and an output signal from a corresponding register and supplying generated exclusive-OR signal as said external write data signal to said determination circuit.

10. The semiconductor test circuit according to claim 7, wherein said semiconductor memory device has a function simultaneously to perform writing/reading of data signals of M×N (each of M and N is an integer greater than or equal to 2) memory cells designated by an address signal as well as a write mask function to inhibit rewriting of the data signals of said M×N memory cells per unit of write mask including N memory cells, and said write data generating circuit generates M×N internal write data signals to be written into said M×N memory cells according to said external write data signal, said semiconductor test circuit comprising:

M×N signal regeneration circuits corresponding to said M×N memory cells, respectively, wherein each of the signal regeneration circuits regenerates said external write data signal based on a read data signal from a corresponding memory cell, and said determination circuit is provided corresponding to each unit of write mask for determining whether logic levels of N external write data signals regenerated by corresponding N signal regeneration circuits all match or not.

* * * * *